United States Patent
Radziun et al.

(10) Patent No.: US 6,384,602 B1
(45) Date of Patent: May 7, 2002

(54) MOUNTING SYSTEM AND RF SHIELD FOR HIGH FIELD OPEN MAGNET

(75) Inventors: Michael J. Radziun, Waterford, WI (US); Long-Zhi Jiang, Florence, SC (US); Gregory A. Lehmann, Florence, SC (US); Gregory F. Hayworth, Florence, SC (US); Kenneth E. Gurt, Florence, SC (US)

(73) Assignee: GE Medical Systems, Waukesha, WI (US)

( * ) Notice: Subject to any disclaimer, the term of this patent is extended or adjusted under 35 U.S.C. 154(b) by 0 days.

(21) Appl. No.: 09/471,547

(22) Filed: Dec. 23, 1999

Related U.S. Application Data

(60) Provisional application No. 60/167,333, filed on Nov. 24, 1999.

(51) Int. Cl.[7] ................................................. G01V 3/00
(52) U.S. Cl. ....................................... 324/318; 324/322
(58) Field of Search ................................. 324/318, 322; 248/637, 638

(56) References Cited

U.S. PATENT DOCUMENTS

| | | | |
|---|---|---|---|
| 2,678,592 A | * | 5/1954 | Wiedman |
| 4,576,271 A | * | 3/1986 | Chalabian ................... 194/233 |

* cited by examiner

Primary Examiner—Hezron Williams
Assistant Examiner—Brij B. Shrivastav

(57) ABSTRACT

A secure and stable mounting system for High Field Open (HFO) magnets. A stainless steel mounting plate is secured to the RF screen room floor and the HFO magnet is secured to the mounting plate. Metal angle members are welded around the perimeter edges of the steel plate, and brass wool is inserted between the angle members and the copper sheeting on the floor of the screen room. The invention minimizes magnet motion and thus reduces the risk of image phase ghosting. The invention also provides RF screen room integrity.

5 Claims, 2 Drawing Sheets

MOUNTING SYSTEM AND RF SHIELD FOR HIGH FIELD OPEN MAGNET

This application claims benefit of Provisional Application Ser. No 60/167,333 filed Nov. 24, 1999.

TECHNICAL FIELD

The present invention relates to high field open magnet devices and, more particularly, to systems for minimizing magnet motion and reducing the risk of image phase ghosting of such devices.

BACKGROUND OF THE INVENTION

High field open (HFO) magnets utilize super-conducting magnet technology to generate magnetic fields. The HFO magnets are particularly used in magnetic resonant imaging (MRI), diagnostic systems in order to diagnose and/or evaluate various conditions in humans. The HFO magnet essentially rotates a cylindrical magnet to a vertical position. This causes a relatively high center of gravity for the magnet leading to problems of adequately securing the HFO device to the ground. Magnetically unstable magnets can produce image phase ghosting and other high magnetic field variations.

There is thus a need for a secure anchoring system for HFO magnets in order to prevent magnet wobbling. There also is a need to securely fasten the HFO magnet to a supporting surface and at the same time maintain RF screen room integrity.

SUMMARY OF THE INVENTION

The present invention provides a system for connecting an HFO magnet device to the ground or other surface and at the same time maintain RF screen room integrity. A large metal plate member is utilized for this purpose, with metal angle members attached around its perimeter in order to maintain requisite RF shield contact and integrity. Preferably, a two inch thick 72-inch by 72-inch stainless steel plate member is utilized. The plate is permanently mounted to the floor or other surface and the HFO device is securely bolted to the metal plate member. This provides the mechanical stability needed for minimizing magnet motion.

A plurality of holes and openings are provided in the plate member, some for connecting the plate to the floor or other surface and others for connecting the HFO magnet device to the plate. The holes for connecting the HFO device to the plate are drilled and tapped for the use of bolts or other fasteners. A plurality of bolts and washers are used to connect the HFO magnet device to the plate and the plate to the floor or other surface. For uneven floors or other surfaces, epoxy, grout or other "mud" is utilized to provide a firm and flat foundation. Standard expansion anchor bolts are utilized to connect the metal plate member to the floor or other surface.

The metal angle members preferably are welded to the four edges of the plate and provide a solid connector to the RF shield room. Brass wool or other RF sealing material is positioned between the angle members and the floor of the RF shield room which normally is covered with a sheet of copper material.

BRIEF DESCRIPTION OF THE DRAWINGS

The invention will now be described, by way of example, with reference to the accompanying drawings, in which.

DESCRIPTION OF THE PREFERRED EMBODIMENT(S)

Figure 1:
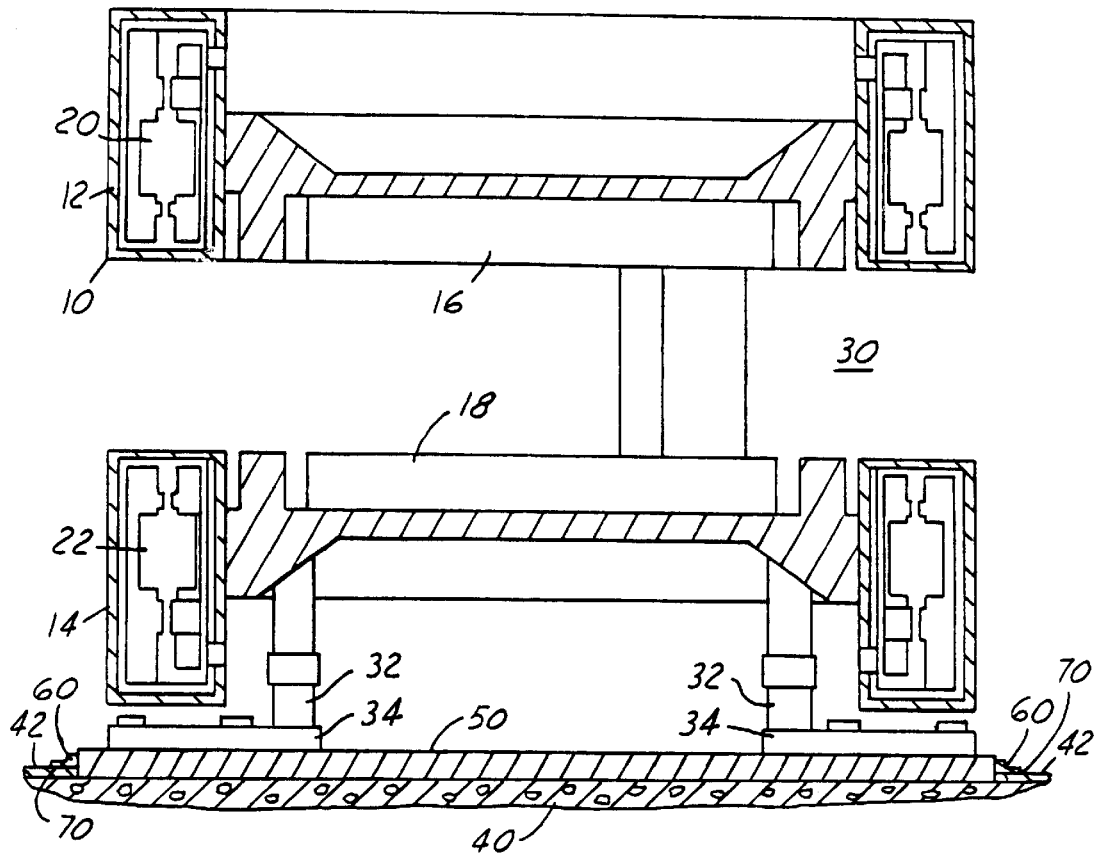
FIG. 1 is a cross-sectional view of a high field open magnet device connected to a floor or other surface by use of the present invention.

The present invention is utilized for mounting a high field open (HFO) magnet to a floor or other surface. HFO magnets (a/k/a open superconductive magnets) are useful in magnetic resonance imaging (MRI) applications. The magnet 10 has two spaced apart assemblies 12 and 14, each assembly having a magnetizable pole piece 16 and 18 and a magnetized ring 20 and 22. The rings are radially spaced outwardly and apart from, and at least partially longitudinally overlapping, the pole pieces.

The details of open superconductive magnets are described in detail in various U.S. patents such as U.S. Pat. Nos. 5,874,882 and 5,883,538, the disclosures of which are hereby incorporated herein by reference. For MRI diagnosis or evaluation, the patent's body or portion thereof is placed in the open area 30 between the two pole pieces 16 and 18.

The magnet 10 is attached to the floor or other surface by a plurality of feet 32, only two of which are shown in FIG. 1. Normally, four feet 32 are provided in the four corners of the HFO magnet. The feet 32 are typically secured to the floor by bolts or other fasteners. For this purpose, the feet 32 have mounting plates 34 which typically have a plurality of holes or other openings in them in order to be fastened to the floor. The floor 40 is typically made of concrete or a similar material and preferably has a layer of copper material 42 positioned on it for RF screen room integrity. The copper material prevents undesirable radiation from affecting the readings from the HFO magnet device 10.

With the present invention, a metal plate 50, preferably made from stainless steel, is utilized to secure the HFO magnet device 10 to the floor 40 or other surface. The plate 50 is dimensioned such that it extends beyond the outer dimensions of the HFO magnet. In this regard, with conventional HFO magnet devices, a two-inch thick 72-inch by 72-inch stainless steel plate is sufficient. The steel plate will increase the stiffness of the magnet and is sufficiently large and heavy so that the magnet cannot cause the plate to move in any direction. The plate is larger than the magnet in order to increase the moment of inertia and spread out the footprint of the magnet.

HFO magnet devices are typically installed in RF screen rooms in order to prevent extraneous RF signals from affecting the readings from the device. For this purpose, a thin layer of copper material, such as layer 42 shown in the drawings, is utilized at least on the floor of the screen room. The RF screen rooms also have a clean room environment.

Figure 2:
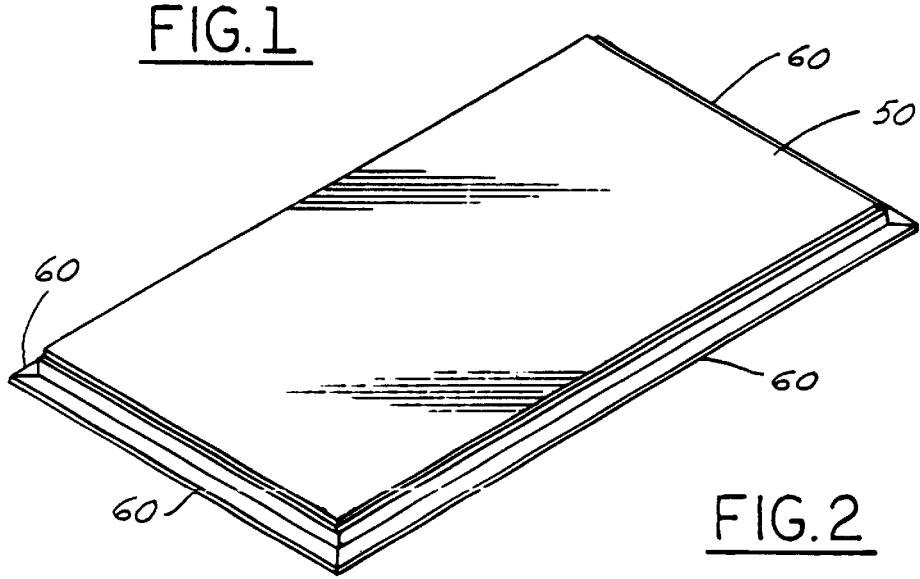
FIG. 2 is a perspective view of a mounting plate in accordance with the present invention.
Figure 3:
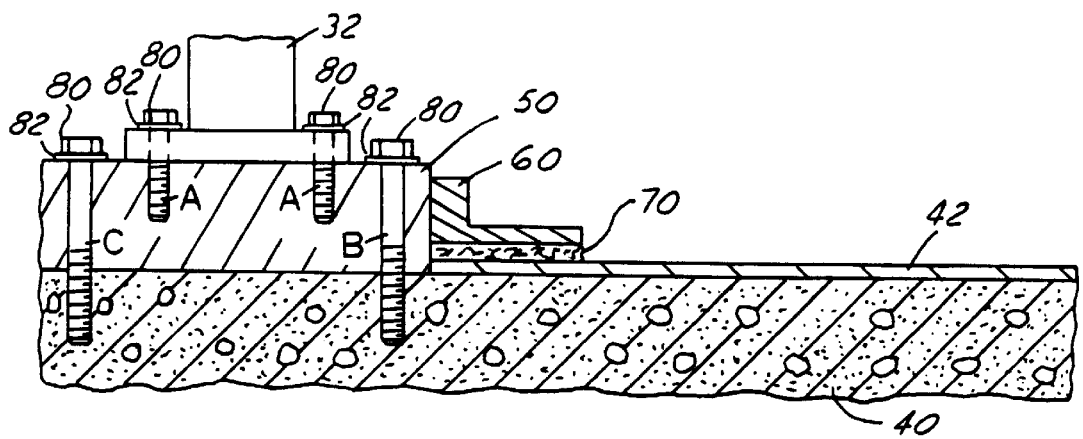
FIG. 3 is a partial cross-sectional view illustrating the mounting of the present invention.
Figure 4:
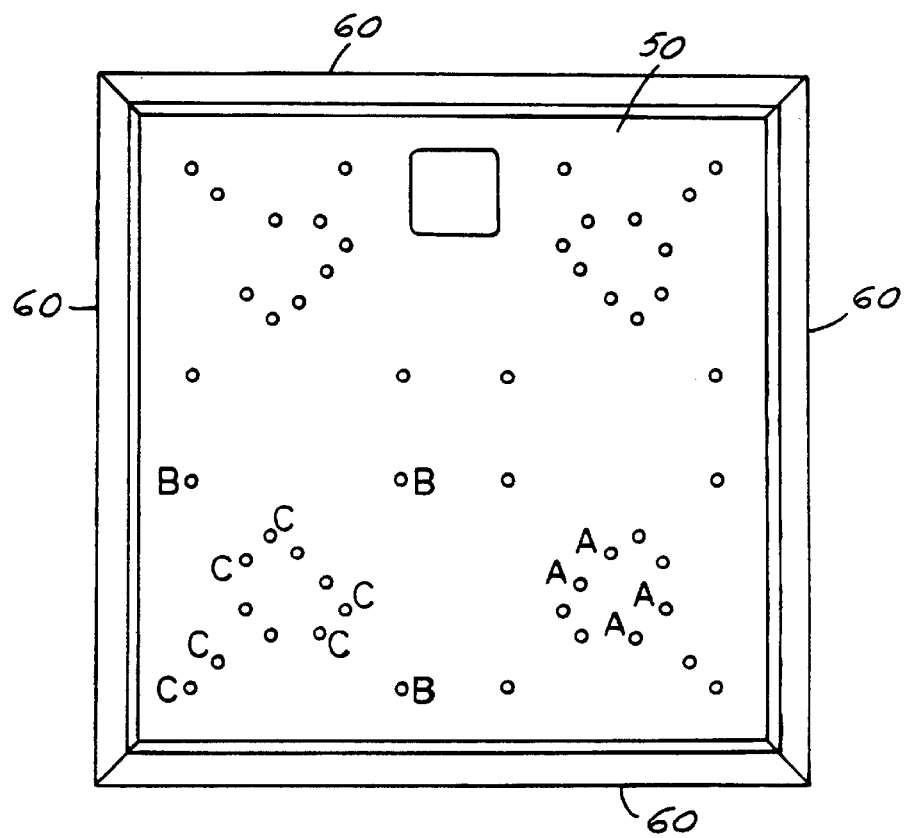
FIG. 4 is a plane or elevational view of the invention illustrating the various mounting holes.

In order to maintain the RF screen room integrity, metal angle members 60 are positioned around the four edges of the stainless steel plate 50. The angle members 60 extend around the entire perimeter of the stainless steel plate as shown in FIGS. 2 and 4. Cross-sections of the angle members are shown in FIGS. 1 and 3. The angle members are also preferably made of stainless steel and are securely fastened to the plate 50 as by welding.

The angle members 60 are substantially L-shaped in cross-section with base portions 61 which are secured to the edges of the plate 50 and outstanding flange portions 62 which protrude outwardly from the plate edges as shown in FIG. 3.

A conductive material 70, such as brass wool, is installed between the metal angle member 60 and the copper material 42 on the floor of the screen room. This also maintains the integrity of the RF screen room. The brass wool provides a compressible seal between the angle members and the copper material 42. In this regard, preferably the angle members extend approximately one inch from the edge of the steel plate 50 in order to provide adequate space and area for the brass wool.

In order to install the steel plate 50 on the concrete floor 40 of the RF screen room, it is often necessary to utilize epoxy, grout, or other mud-type materials in order to accurately position and lay the steel plate 50 on the floor. In this regard, the top surface of the plate members should be positioned as flat as possible.

A plurality of holes are provided in the steel plate 50. Some of the holes are through-holes in order to allow attachment of the steel plate 50 to the concrete floor 40. A number of the other holes are drilled and tapped holes which are used to secure the feet and mounting plates of the HFO magnet device to the steel plate.

For the preferred embodiment, the plurality of holes as shown in FIG. 4 are provided. Twelve "B" through-holes are provided in the steel plate and are used at all times to connect the steel plate 50 to the concrete floor 40. In addition, there are 24 "C" through-holes provided in the metal plate, six in each quadrant. At least three of the six "C" through-holes are utilized in every installation, depending on the building. Also, there are sixteen "A" holes which are drilled and tapped, four in each quadrant of the plate. These holes are used to connect the HFO device to the metal plate.

Steel bolts or other conventional fasteners 80 are used to connect the steel plate to the floor 40 and the HFO device to the steel plate. In addition, stainless steel washers 82 are utilized on each of the bolts or other fasteners. Also, split "lock-washers" are typically used to help clamp the HFO device to the stainless steel plate.

While particular embodiments of the invention have been shown and described, numerous variations and alternate embodiments will occur to those skilled in the art. Accordingly, it is intended that the invention be limited only in terms of the appended claims.

What is claimed is:

1. A mounting system for an HFO magnet, the HFO magnet having a plurality of mounting feet thereon, said mounting system comprising:
    a metal plate member;
    a plurality of metal edge members attached to the perimeter of said plate member and extending outwardly therefrom; and
    said metal plate member having a first plurality of through-holes for connecting said metal plate member to a floor or other surface, and a second plurality of drilled and tapped holes for connecting the mounting feet of the HFO magnet to said metal plate member.

2. The mounting system as recited in claim 1 wherein said plate member and metal edge members are made of a stainless steel material.

3. The mounting system as recited in claim 1 wherein said plate member is about two inches in thickness and about seventy-two inches by seventy-two inches in dimension.

4. The mounting system as recited in claim 1 wherein said metal edge members are angle members and are welded on the edges of said metal plate member.

5. A mounting system for an HFO magnet in an RF screen room, said HFO magnet having a plurality of mounting feet thereon and said RF screen room having copper plating at least on the floor surface, said mounting system comprising:
    a stainless steel mounting plate member;
    a plurality of stainless steel angle members secured to the perimeter of said plate member, said angle members having flanges thereon extending from said plate member, and
    metal wool sealing material positioned adjacent said flanges,
    wherein when said plate member is positioned on the floor surface of the RF screen room, said sealing material is positioned between said flanges and said copper plating on the floor surface.

* * * * *